United States Patent [19]

Casey et al.

[11] Patent Number: 4,662,989

[45] Date of Patent: May 5, 1987

[54] HIGH EFFICIENCY METAL LIFT-OFF PROCESS

[75] Inventors: Daniel K. Casey, Elk River; Eddie C. Lee, Bloomington, both of Minn.

[73] Assignee: Honeywell Inc., Minneapolis, Minn.

[21] Appl. No.: 784,925

[22] Filed: Oct. 4, 1985

[51] Int. Cl.[4] .................. B44C 1/22; C03C 15/00; C03C 25/06; B29C 37/00

[52] U.S. Cl. .................... 156/655; 156/656; 156/659.1; 156/664; 156/668; 427/89; 427/96; 430/315

[58] Field of Search .............. 156/655, 659.1, 656, 156/664, 668; 427/88–91, 96; 430/313, 315, 317, 329; 29/591

[56] References Cited

U.S. PATENT DOCUMENTS

| | | | |
|---|---|---|---|
| 3,873,361 | 3/1975 | Franco et al. | 117/212 |
| 3,948,706 | 4/1976 | Schmeckenbecher | 156/89 |
| 4,004,044 | 1/1977 | Franco et al. | 427/43 |
| 4,064,290 | 12/1977 | Ebel et al. | 427/97 |
| 4,119,483 | 10/1978 | Hubsch et al. | 156/655 |

OTHER PUBLICATIONS

IBM Technical Disclosure Bull., vol. 13, No. 9, Feb. 1971.
IBM Technical Disclosure Bull., vol. 20, No. 3, Aug. 1977.
IBM Technical Disclosure Bull., vol. 21, No. 8, Jan. 1979.

*Primary Examiner*—William A. Powell
*Attorney, Agent, or Firm*—William T. Udseth

[57] ABSTRACT

An improved high efficiency metal lift-off process for removing a layer of metal at least partially covering a layer of photoresist. The method comprises forming microcracks located above the layer of photoresist in the layer of metal to be removed and providing solvent to the layer of photoresist through the microcracks.

12 Claims, 5 Drawing Figures

HIGH EFFICIENCY METAL LIFT-OFF PROCESS

BACKGROUND OF THE INVENTION

The present invention is an improved metal lift-off process for use in processing integrated circuits, masks, and similar items. Conventional photoresist lift-off processes for metal layers typically require many hours of soaking in a solvent before the desired metal layer can be removed. The present process substantially reduces this time, typically to a time on the order of minutes or less, significantly reducing cost and cycle time.

SUMMARY OF THE INVENTION

The present invention is an improved high efficiency metal lift-off process for removing a layer of metal at least partially covering a layer of photoresist. The method comprises forming microcracks above the layers of photoresist in the layer of metal to be removed and providing solvent to the layer of photoresist through the microcracks.

DETAILED DESCRIPTION OF THE PREFERRED EMBODIMENTS

Figure 1:
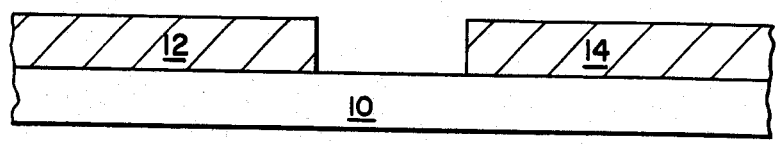
FIGS. 1-5 illustrate a process compatible with the present invention.
Figure 2:
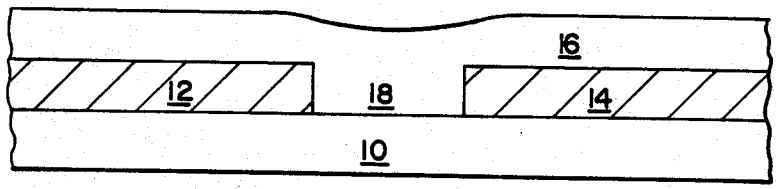
Figure 3:
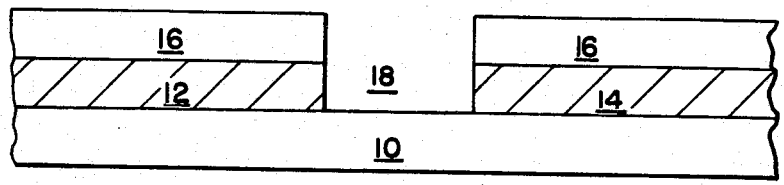

Metal lift-off processes are typically employed when two metalization regions presently separated from one another need to be joined. FIG. 1 illustrates a substrate, mask or other carrier 10 on which first layer metalizations 12 and 14 have been formed. The objective will be to connect first layer metals 12 and 14 with a patch. This can be accomplished by first depositing a layer 16 of photoresist over the first layer of metal comprising metalizations 12 and 14 (see FIG. 2). The photoresist 16 in region 18 between metal interconnects 12 and 14 is then typically exposed through the back side of carrier 10 and etched away so that region 18 is no longer covered with photoresist (see FIG. 3). A metal patch interconnecting regions 12 and 14 is then deposited by depositing a second metal layer, thus forming a second metal layer 20 covering photoresist layer 16 and filling region 18 to form a patch 21 interconnecting metalizations 12 and 14. The first and second metal layers may comprise any metal typically used for metal interconnects or mask processing; Al/Cu is an example of such a metal, but other materials may also be used, as well is recognized by those skilled in the art. The first and second metal layers are typically deposited by sputtering.

Figure 4:
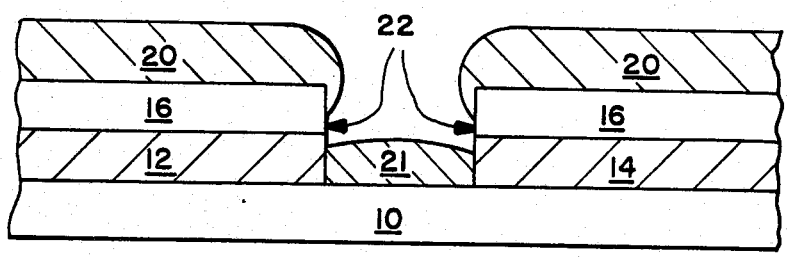

Following the sequence described above, it is typically desired to remove photoresist layer 16 and, therefore, all of second metallization layer 20 except patch 21 between metallization interconnects 12 and 14. Prior art processes rely on the fact that, as can be seen in FIG. 4, step coverage over the end regions of photoresist layer 16 is typically not complete, and photoresist layer 16 typically remains exposed in regions 22 in the area of patch 21. Accordingly, using typical prior art processes, photoresist layer 16 and the metal layer 20 covering it is removed by exposing regions 22 to solvent which will gradually dissolve photoresist layer 16, thereby causing metallization layer 20 to be removed. This process typically takes hours to complete since there are only very small regions 22 where solvent may attack photoresist 16. This is in contrast to the present invention, with which the lift off can typically be accomplished in minutes.

Figure 5:
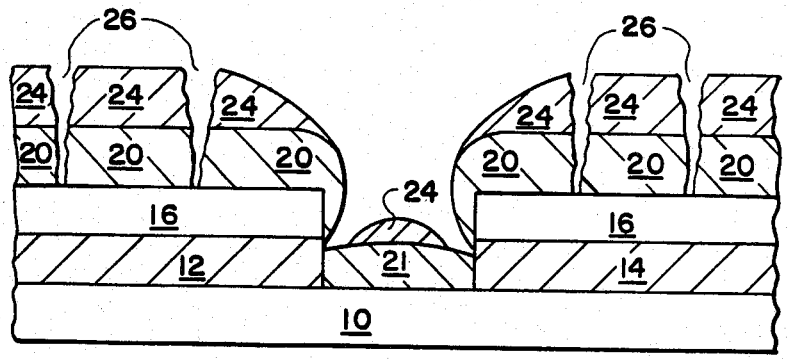

The preferred process of practicing the present invention is illustrated in FIG. 5. The preferred process comprises placing a third layer of material 24 on top of second metal layer 20 with layer 24 having a film stress opposite in direction to that of second metal layer 20. By having sufficient magnitude as discussed below, this opposite stress level in layer 24 will cause microcracks 26 to develop on the surface of the structure and through both layers 2 and 20. Solvent can then attack photoresist layer 16 directly through the microcracks, and the entire lift-off process is reduced in time to a matter of minutes or less, typically less than one minute. The remaining third layer 24 on top of metal patch 21 may be removed using a mutually exclusive etch between second metal layer 20 (which forms patch 21) and metal 24. Third layer 24 may comprise Cr, TiW, or W, although other metals may also be employed; third layer 24 may also comprise a dielectric. Layer 24 is typically applied by a process of sputtering.

The stress magnitude and direction of second metal layer 20 is measured by the wafer bending method, a process familiar to those skilled in the art. This measurement is performed on a pilot wafer coated with the same material and thickness as layer 20. Using such a measurement process, it can be determined whether second metallization layer 20 is in compression or tension. Third layer 24 may then be applied so that it has a stress in the opposite direction (e.g., applied so that it is in tension if second layer metal 20 is in compression). This opposite stress direction may be obtained by selecting the type of material (e.g., if layer 20 is Al/2% Cu, then layer 24 can be Cr, TiW, W, or a dielectric) or by adjusting the thickness of layer 24 to tailor the magnitude of the stress. The selected material may be deposited by sputtering. The stress magnitude and direction of layer 24 can also be adjusted by introducing gas in the sputtering reaction chamber.

Excellent results have been obtained where the stress in third layer 24 is in a substantially opposite direction of the stress in second metal layer 22 and where the level of the stress in layer 24 is at least one order of magnitude greater than the level of stress in layer 22; suitable results have also been obtained with stress levels between the two layers being somewhat less than an order of magnitude apart.

Note that the present invention will provide a metalization lift-off process even if second metallization layer 20 does not leave small openings 22 at the ends of photoresist layer 16. In other words, as shown in FIG. 5, no small regions 22 need to exist as shown in FIG. 4; even without regions 22, photoresist layer 16 and the covering metallization layers 20 and 24 may be removed quickly and easily by having the solvent attack photoresist 16 entirely through microcracks 26.

We claim:

1. A high efficiency metal lift-off process for removing a layer of metal at least partially covering a layer of photoresist, the process comprising:
    applying an additional layer of material over the layer of metal to be removed so that the additional layer of material causes microcracks to develop through both the layer of metal to be removed and the additional layer of material; and
    providing solvent to the photoresist layer through the microcracks.

2. The process of claim 1 wherein the additional layer of material comprises a metal.

3. The process of claim 2 wherein the additional layer of material comprises a metal selected from the group consisting of Cr, TiW, and W.

4. The process of claim 1 wherein the additional layer of material comprises a dielectric.

5. A high efficiency metal lift-off process for removing a layer of metal at least partially covering a layer of photoresist, the layer of metal to be removed having a stress in a first predetermined direction, the method, comprising:

depositing an additional layer of material over the layer of metal to be removed, the additional layer of material having a stress in a direction substantially opposite to the first predetermined direction, thus forming microcracks through both the metal layer to be removed and the additional layer of material; and providing solvent to the photoresist layer through the microcracks.

6. The process of claim 5 wherein the level of stress in the additional layer of material is at least one order of magnitude greater than the level of stress in the layer of metal to be removed.

7. The process of claim 6 wherein the additional layer of material comprises a metal.

8. The process of claim 7 wherein the additional layer of material comprises a metal selected from the group consisting of Cr, TiW, and W.

9. The process of claim 6 wherein the additional layer of material comprises a dielectric.

10. The process of claim 5 wherein the additional layer of material comprises a metal.

11. The process of claim 10 wherein the additional layer of material comprises a metal selected from the group consisting of Cr, TiW, and W.

12. The process of claim 5 wherein the additional layer of material comprises a dielectric.

* * * * *